(12) United States Patent
Lee

(10) Patent No.: US 7,655,524 B2
(45) Date of Patent: Feb. 2, 2010

(54) METHOD FOR MANUFACTURING ISOLATION LAYER HAVING BARRIER LAYER FORMED THEREON

(75) Inventor: Jong Bok Lee, Incheon (KR)

(73) Assignee: Dongbu HiTek Co., Ltd., Seoul (KR)

( * ) Notice: Subject to any disclaimer, the term of this patent is extended or adjusted under 35 U.S.C. 154(b) by 65 days.

(21) Appl. No.: 11/609,866

(22) Filed: Dec. 12, 2006

(65) Prior Publication Data

US 2007/0145490 A1 Jun. 28, 2007

(30) Foreign Application Priority Data

Dec. 26, 2005 (KR) .................. 10-2005-0129231

(51) Int. Cl.
*H01L 21/336* (2006.01)

(52) U.S. Cl. .................. 438/296; 438/435; 438/586; 438/770; 257/E21.546; 257/E21.55

(58) Field of Classification Search .................. 438/207, 438/218, 219, 221, 222, 294–297, 353, 355, 438/359, 362, 400, 404, 424–427, 435–437, 438/439, 444, 527, 770–774, 778, 787, 586; 257/374, 446, 51, 506, E21.54, E21.542, 257/E51.545, E21.546, E21.548, E21.549, 257/E21.55, E21.553, E21.555, E21.559, 257/E21.628, E21.642

See application file for complete search history.

(56) References Cited

U.S. PATENT DOCUMENTS

| | | | | |
|---|---|---|---|---|
| 6,323,104 B1* | 11/2001 | Trivedi | .................. | 438/424 |
| 6,333,232 B1* | 12/2001 | Kunikiyo | .................. | 438/296 |
| 6,350,655 B2* | 2/2002 | Mizuo | .................. | 438/296 |
| 6,355,966 B1* | 3/2002 | Trivedi | .................. | 257/499 |
| 6,440,817 B2* | 8/2002 | Trivedi | .................. | 438/424 |
| 6,730,582 B2* | 5/2004 | Wu et al. | .................. | 438/527 |
| 6,797,579 B2* | 9/2004 | Yoo et al. | .................. | 438/311 |
| 6,955,955 B2* | 10/2005 | Chen et al. | .................. | 438/165 |
| 7,288,447 B2* | 10/2007 | Chen et al. | .................. | 438/165 |
| 7,553,741 B2* | 6/2009 | Ipposhi | .................. | 438/425 |
| 2001/0026980 A1* | 10/2001 | Mizuo | .................. | 438/296 |
| 2004/0029352 A1* | 2/2004 | Beyer et al. | .................. | 438/404 |
| 2004/0082141 A1* | 4/2004 | Mizukoshi | .................. | 438/424 |
| 2004/0135199 A1* | 7/2004 | Seo | .................. | 257/330 |
| 2005/0064721 A1* | 3/2005 | Tsai et al. | .................. | 438/740 |
| 2005/0136619 A1* | 6/2005 | Seo | .................. | 438/435 |
| 2006/0261436 A1* | 11/2006 | Turner et al. | .................. | 257/506 |

FOREIGN PATENT DOCUMENTS

| | | |
|---|---|---|
| KR | 100200731 | 3/1999 |
| KR | 10-2003-0082785 | 10/2003 |
| KR | 10-2005-0069585 | 7/2005 |

OTHER PUBLICATIONS

Definition of word "over " from http://www.dictionary.com.*

* cited by examiner

*Primary Examiner*—Matthew C Landau
*Assistant Examiner*—Joseph C. Nicely
(74) *Attorney, Agent, or Firm*—Sherr & Vaughn, PLLC

(57) ABSTRACT

Embodiments relate to a semiconductor device and a method for manufacturing a semiconductor device. In embodiments, a transistor including the gate electrode and a source/drain may be formed between isolation layers and a contact may be connected to the source/drain. A barrier layer may be formed at a boundary between the isolation layer and the source/drain and may physically isolate the isolation layer from the source/drain.

9 Claims, 5 Drawing Sheets

METHOD FOR MANUFACTURING ISOLATION LAYER HAVING BARRIER LAYER FORMED THEREON

The present application claims priority under 35 U.S.C. 119 and 35 U.S.C. 365 to Korean Patent Application No. 10-2005-0129231 (filed on Dec. 26, 2005), which is hereby incorporated by reference in its entirety.

BACKGROUND

A plurality of device cells, such as transistors and capacitors, may be integrated on a limited area of a semiconductor device according to a capacity of the semiconductor device. Such cells may be electrically separated from each other such that they can individually operate.

To electrically isolate the cells from each other, a local oxidation of silicon (LOCOS) process, in which a silicon substrate is recessed and then a field oxide layer is grown, and a trench isolation process, in which a trench is formed through an etching process and then an insulating material is filled in the trench, may be used. The trench isolation process may be suitable for a highly integrated semiconductor device where a spacing interval between cells (or unit elements) has been reduced.

According to related art, a semiconductor device may be fabricated by forming an isolation layer on a semiconductor substrate, sequentially forming a gate electrode and source/drain regions, and sequentially forming an interlayer dielectric layer, a contact, and a metal interconnection.

Hence, in the related art, a source/drain may be formed through ion implantation after forming a gate electrode and then a contact may be formed by selectively removing an interlayer dielectric layer.

A related art semiconductor device may have opposite-type dose doping due to misalignment when the source/drain regions are formed through an ion implantation process, for example after the gate electrode has been formed. Such a problem may lead to a leakage current, which may lower a reliability of a semiconductor device.

FIG. 1 is a photographic image showing an example test result, in which a contact spike has occurred, for example due to misalignment when patterning the contact through a related art method.

As shown in FIG. 1, according to a related art method for fabricating a semiconductor device, thick interlayer dielectric layer 106 may be formed after isolation layer 104 and a transistor have been formed. Part of interlayer dielectric layer 106 may then be selectively removed to form contact 114. However, if a misalignment occurs when forming the contact, a contact spike (see, for example, section A in FIG. 1) may be created. Such a contact spike may degrade the characteristics of the semiconductor device.

SUMMARY

Embodiments relate to a semiconductor device and a manufacturing method thereof, that may prevent overlap of opposite type dose doping that may be caused by a misalignment of a mask pattern when a source/drain region is patterned.

Embodiments relate to a semiconductor device and a manufacturing method thereof that may prevent creation of a contact spike that may be caused by misalignment when forming a contact, for example to be connected to a source/drain.

In embodiments, a semiconductor device may include a transistor formed between isolation layers and including a gate electrode and a source/drain, a contact connected to the source/drain, and a barrier layer formed at a boundary area between the isolation layer and the source/drain, that may physically isolate the isolation layer from the source/drain.

In embodiments, a method for manufacturing a semiconductor device may include forming a pad nitride layer on a semiconductor substrate including isolation layer area and a source/drain area, forming a barrier layer area by selectively removing a part of the pad nitride layer such that a part of the semiconductor substrate is exposed, forming a barrier layer on the exposed semiconductor substrate such that the barrier layer physically isolates the isolation layer area from the source/drain area at a boundary area therebetween, forming an isolation layer by removing a part of the semiconductor substrate formed below the isolation layer area, sequentially forming a gate electrode and a source/drain between adjacent isolation layers, and forming a contact connected to the source/drain area.

DETAILED DESCRIPTION OF EMBODIMENTS

In embodiments, a barrier layer may have a pattern defining a width of an isolation area. The barrier layer may be formed before forming an STI (shallow trench isolation) layer. A device, for example a transistor including an STI layer, a gate electrode and a source/drain, and a contact may then be sequentially formed. In addition, a barrier layer may be provided at a boundary area between the STI layer and the source/drain, and may physically isolate the STI layer from the source/drain. This may prevent opposite type dose doping that may occur when forming the source/drain due, for example, to a misalignment of a mask pattern. It may also prevent a contact spike that may be caused by misalignment of the contact mask pattern.

Figure 2:
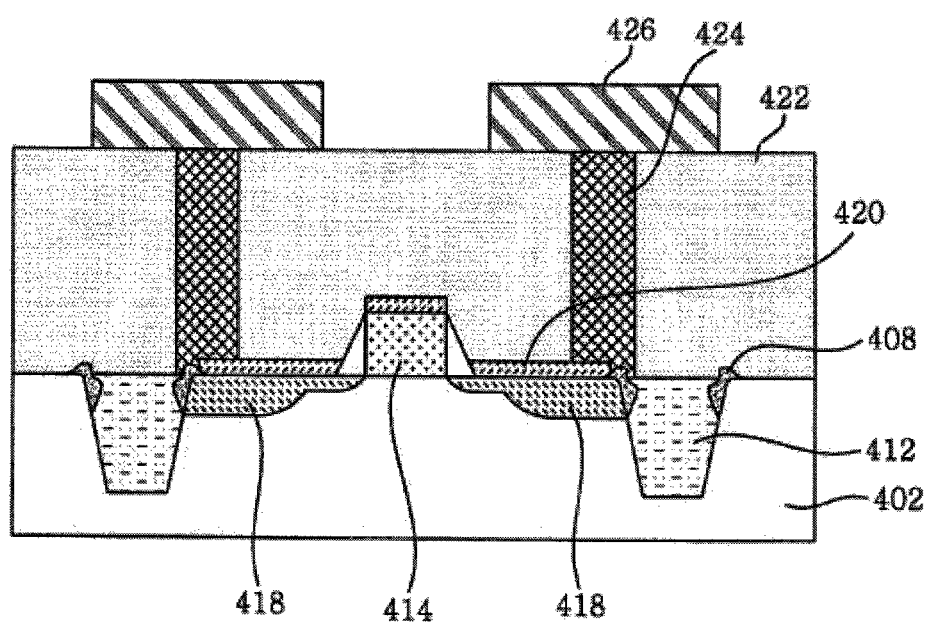
FIG. 2 is an example sectional illustration of a semiconductor device according to embodiments.

FIG. 2 is a sectional illustration of a semiconductor device according to embodiments.

In embodiments, STI (Shallow Trench Isolation) layer 412 may be used as an example of an isolation layer. However, embodiments are not limited thereto.

Referring to FIG. 2, a semiconductor device according to embodiments may include STI layers 412 formed in prescribed portions of semiconductor substrate 402. STI layer 412 may isolate unit devices (e.g. transistors) from each other. A transistor, which may include gate electrode 414, and source/drain 418, may be formed between adjacent STI layers 412. Silicide layer 420 may be formed on a top surface of source/drain 418.

In addition, a semiconductor device according to embodiments may include an interlayer dielectric layer 422, that may be formed on STI layer 412 and the transistor. Interlayer dielectric layer 422 may be formed to be thicker than other layers. Contacts 424 may be formed and may extend by passing through interlayer dielectric layer 422. Contacts 424 may be physically (e.g. electrically) connected to source/drain 418. Metal interconnections 426 having a prescribed pattern may be formed on contacts 424.

In addition, a semiconductor device according to embodiments may include barrier layer 408, which may have a prescribed size, and maybe formed at a boundary area between STI layer 412 and source/drain 418. Barrier layer 408 may have a pattern defining a width of an STI area before STI layer 412 is formed, and may be formed through an oxidation process.

Accordingly, since barrier layer 408 having a prescribed size may be formed at a boundary area between STI layer 412 and source/drain 418 while physically isolating STI layer 412 from source/drain 418, barrier layer 408 may effectively shield the opposite type dose doping, even if misalignment occurs when forming (patterning) the source/drain 418. A reliability of a semiconductor device may thereby be improved.

In addition, since barrier layer 408 may be formed at a boundary area between STI layer 412 and source/drain 418, a contact spike (see, e.g. section A in FIG. 1) may be effectively prevented even if a misalignment occurs during formation of contact 424. A semiconductor device having a higher reliability may thereby be produced.

Hereinafter, a method for manufacturing a semiconductor device according to embodiments will be described.

FIGS. 3A to 3F are sectional illustrations of a procedure for manufacturing a semiconductor device according to embodiments.

Figure 3A:
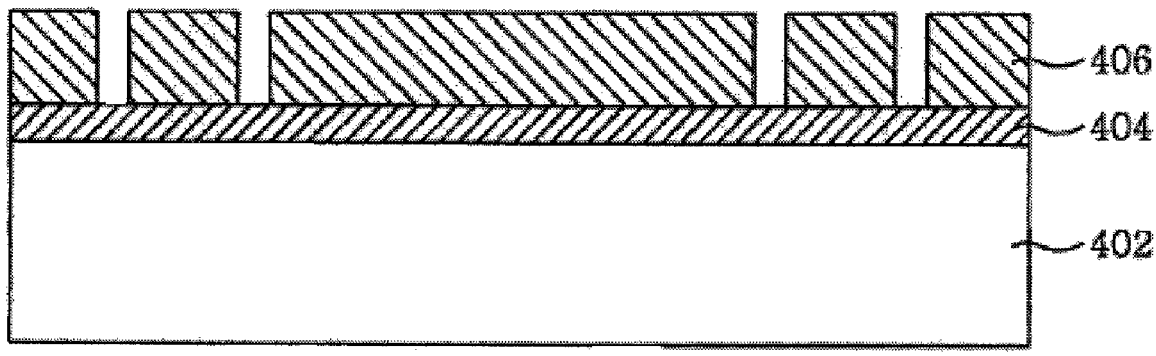
FIGS. 3A to 3F are example sectional illustrations of a procedure for manufacturing a semiconductor device according to embodiments.

Referring to FIG. 3A, pad nitride layer 404, for example having a thickness in a range of about 1500 Å to about 2500 Å, may be deposited on semiconductor substrate 402, and may be formed with trenches for device isolation through a CVD process.

A photolithography process may be performed, and may form first mask pattern 406, which may define a width of an STI area that may be formed through subsequent processes, on pad nitride layer 404. After that, the etching process may be performed, for example by using first mask pattern 406 as an etch barrier. A barrier layer area, for example that may define a width of the STI area that may be formed through subsequent processes, may thereby be formed. That is, the barrier layer area may be formed by partially exposing an upper portion of semiconductor substrate 402.

Barrier layer 408 may be formed on an exposed portion of semiconductor substrate 402. According to embodiments, barrier layer 408 may include insulating materials. For instance, according to embodiments, barrier layer 408 may include an oxide layer. However, embodiments are not limited thereto.

In embodiments, barrier layer 408 may be formed through a thermal process. For example, barrier layer 408 may be formed in the barrier layer area by performing an oxidation process with respect to the exposed portion of semiconductor substrate 402. First mask pattern 406 may then be removed.

According to embodiments, barrier layer 408 may be formed to have a thickness of approximately 1000 Å to 3000 Å, for example by performing a thermal oxidation process with respect to the exposed portion of semiconductor substrate 402 for approximately 30 minutes to 2 hours at a temperature of approximately 800° C. to 1200° C. According to embodiments, if a nitride layer or a TEOS layer is directly formed on the exposed semiconductor substrate 402, instead of an oxide layer, a leakage current may occur at an interfacial surface due to stress, and it may deteriorate certain characteristics of the semiconductor device.

Figure 4:
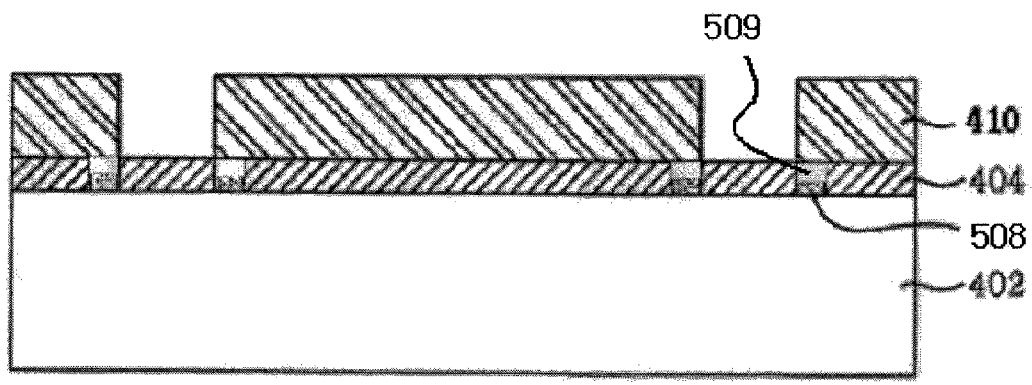
FIG. 4 is an example sectional illustration of a procedure for manufacturing a semiconductor device according embodiments.

In addition, according to embodiments, and as shown in FIG. 4, a barrier layer may be prepared in the form of a dual layer, and may include oxide layer 508 and nitride layer 509.

For example, referring to FIG. 4, oxide layer 508 may be formed on an exposed portion of semiconductor substrate 402, and may have a thickness of approximately 100 Å to 300 Å. Oxide layer 508 may be formed by performing the thermal oxidation process with respect to the exposed portion of semiconductor substrate 402 for approximately 30 minutes to 1 hour and 30 minutes at a temperature of about 800° C. to 1000° C. Nitride layer 509 may be formed on oxide layer 508, and may have a thickness of approximately 1500 Å to 2500 Å. Nitride layer 509 may be formed by performing a deposition process with respect to the exposed portion of semiconductor substrate 402 formed with oxide layer 508 for approximately 30 minutes to 1 hour and 30 minutes at a temperature of approximately 600° C. to 900° C. In embodiments, certain characteristics of a semiconductor device may be improved and may not cause stress due to the interfacial surface between the barrier layer and semiconductor substrate 402.

Figure 5:
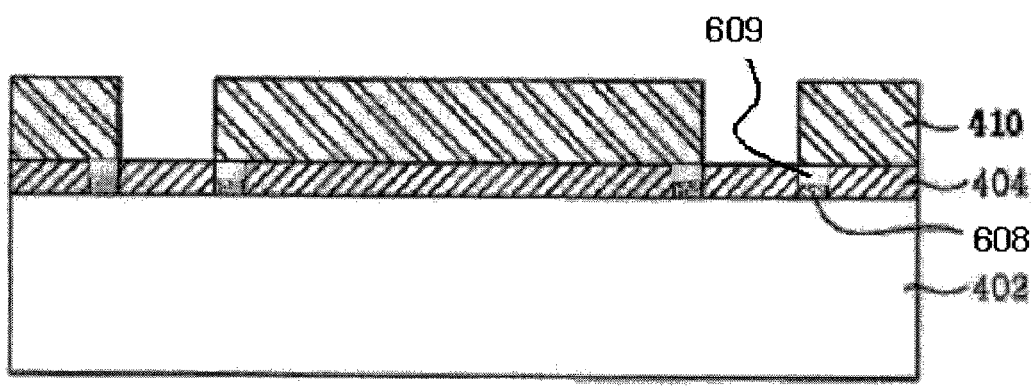
FIG. 5 is an example sectional illustration of a procedure for manufacturing a semiconductor device according to embodiments.

In addition, according to embodiments, and as shown in FIG. 5, a barrier layer may be prepared in the form of a dual layer, and may include oxide layer 608 and TEOS layer 609.

Referring to FIG. 5, oxide layer 608 may be formed on an exposed portion of semiconductor substrate 402, and may have a thickness of approximately 100 Å to 300 Å. Oxide layer 608 may be formed by performing a thermal oxidation process with respect to the exposed portion of semiconductor substrate 402 for approximately 30 minutes to 1 hour and 30 minutes at a temperature of approximately 800° C. to 1000° C. TEOS layer 609 may be formed on oxide layer 608, and may have a thickness of approximately 1500 Å to 2500 Å. TEOS layer 609 may be formed by performing a CVD process with respect to the exposed portion of semiconductor substrate 402 formed with the oxide layer 608 for approximately 1 hour to two hours at a temperature of approximately 600° C. to 800° C. In embodiments, certain characteristics of a semiconductor device may be improved without causing stress to the interfacial surface between the barrier layer and semiconductor substrate 402.

Figure 3B:
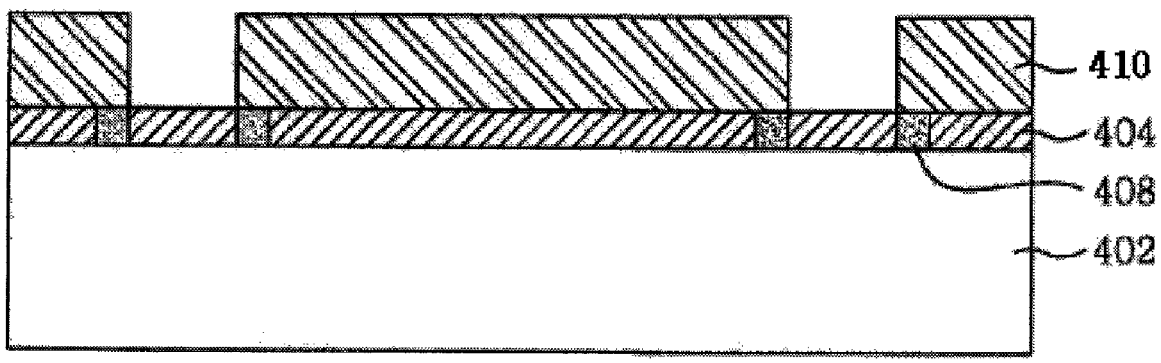

Referring to FIG. 3B, a photolithography process may be performed relative to a top surface of semiconductor substrate 402 formed with barrier layer 408. Second mask pattern 410, for example having a pattern structure capable of selectively exposing a top surface of pad nitride layer 404 formed on the STI area, may thereby be formed.

Figure 3C:
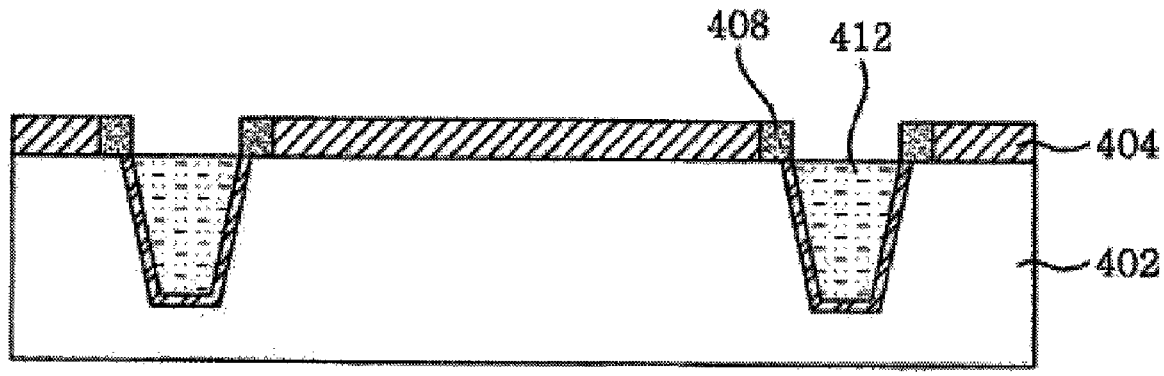

Referring to FIG. 3C, a dry etching process may be performed, for example by using second mask pattern 410 as an etch barrier. Parts of pad nitride layer 404 and semiconductor substrate 402 may thereby be selectively removed and may form trenches. A gap fill process may then be carried out, and may form STI layers 412 on semiconductor substrate 402.

Figure 3D:
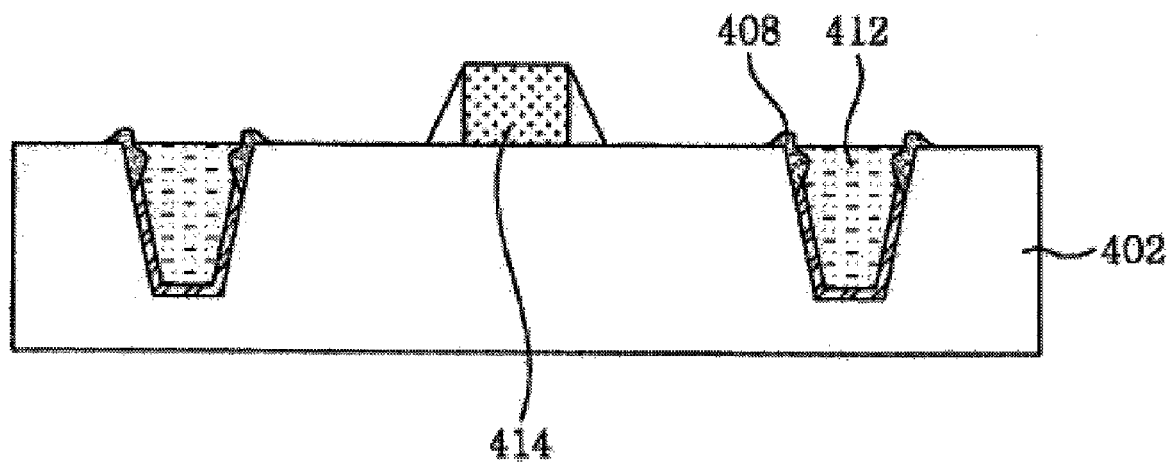

Referring to FIG. 3D, gate electrode 414, which may have a sidewall spacer formed with a prescribed pattern, may be formed at a target position between adjacent STI layers 412.

According to embodiments, an oxidation process (e.g. heat-treatment process) maybe performed after forming gate electrode 414 on semiconductor substrate 402. Barrier layer 408 may diffuse into a lower portion of STI layer 412, for example due to the oxidation process. In embodiments, diffusing barrier layer 408 into the lower portion of STI layer 412 through the oxidation process may physically insulate STI layers 412 from source/drain 418 which may be formed on a prescribed area of semiconductor substrate 402 through subsequent processes.

Figure 3E:
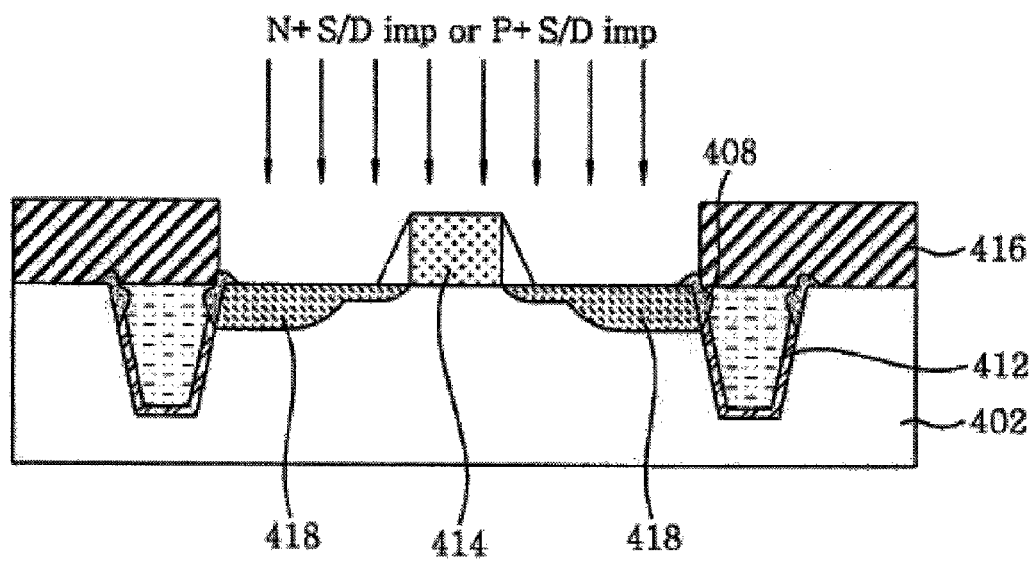

Referring to FIG. 3E, a photolithography process may be performed, and may form a third mask pattern 416. Third mask pattern 416 may have a pattern structure capable of selectively exposing gate electrode 414 and source/drain 418 that may be formed later through subsequent processes.

Next, an N+ type or a P+ type ion implantation process may be performed using third mask pattern 416 and gate electrode 414 as ion shielding layers. Source/drain 418 may thereby be formed in semiconductor substrate 402. Thus, a transistor including gate electrode 414 and source/drain 418 may be formed.

Without the barrier layer 408, if a misalignment were to occur in third mask pattern 416, opposite type dose doping may occur during the ion implantation process. However, according to embodiments, barrier layer 408 may be formed at a boundary between STI layer 412 and source/drain 418, and may therefore physically isolate STI layer 412 from source/drain 418. Hence, opposite type dose doping may be prevented due to barrier layer 408 even if a misalignment occurs when forming source/drain 418 through the ion implantation process. Thus, it may be possible to fabricate a semiconductor device having high reliability.

Silicide layer 420 may then be selectively formed on a prescribed portion of semiconductor substrate 402 formed with the STI layers 412 and the transistor. In embodiments, silicide layer 420 may be selectively formed on top surfaces of gate electrode 414 and source/drain 418. Interlayer dielectric layer 422, for example that may have having a thickness of several thousand ångströms (Å), may be formed on a surface of semiconductor substrate 402, for example by performing a deposition process such as an APCVD process. A transistor may be completely covered with interlayer dielectric layer 422.

Figure 3F:
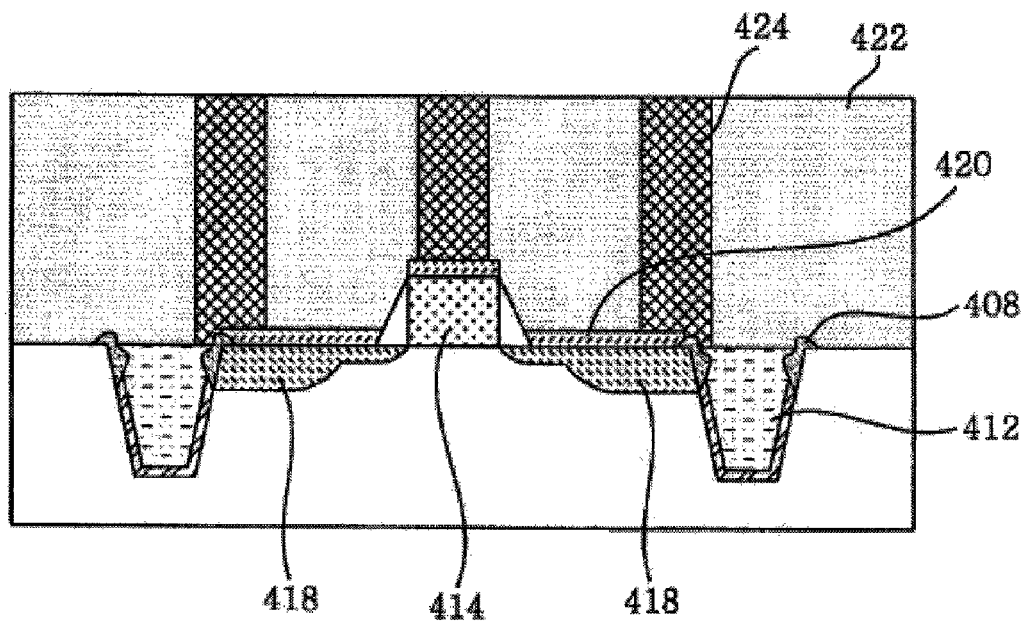

Referring to FIG. 3F, a selective etching process may be performed, for example by using a fourth mask pattern (not shown), and may selectively remove a part of interlayer dielectric layer 422. A contact hole that may expose say top surface of source/drain 418 may thereby be formed. After that, a gap fill process may be performed in order to fill the contact hole with conductive materials, and may thereby form contact 424, which may be electrically connected to source/drain 418.

Contact 424 may be connected to both STI layer 412 and the source/drain 418, for example by interposing barrier layer 408 therebetween, a contact spike may be prevented.

Figure 1:
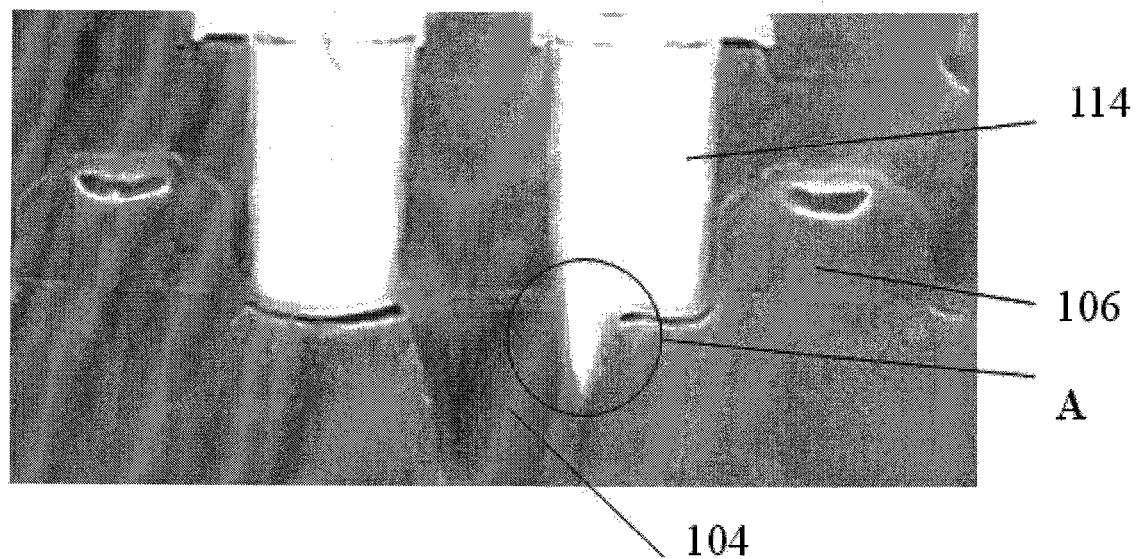
FIG. 1 is a photographic image showing an example related art test result including a contact spike.

That is, a misalignment of fourth mask pattern may occur when defining (patterning) the contact hole to form contact 424. If misalignment of the mask pattern occurs, a contact spike may be generated at a lower portion of the contact, for example as shown in FIG. 1. However, according to embodiments, barrier layer 408 may be formed at a boundary between STI layer 412 and source/drain 418 and may physically isolate STI layer 412 from source/drain 418. Accordingly, a contact spike may be prevented from being generated at a lower portion of contact 424, even if a misalignment of the mask pattern occurs when forming the contact hole. Thus, it may be possible to fabricate a semiconductor device having high reliability.

According to embodiments, a barrier layer may be formed, and may have a pattern that defines a width of an isolation area before the STI layer is formed. A transistor including the STI layer, a gate electrode and a source/drain, and a contact may be sequentially formed. According to embodiments, a barrier layer may be provided at a boundary area between the STI layer and source/drain, and may physically isolate the STI layer from the source/drain. This may serve to prevent opposite type dose doping that may occur when forming the source/drain, for example due to a misalignment of the mask pattern, and may also serve to prevent a contact spike caused by misalignment of the contact pattern. According to embodiments, a reliability of a semiconductor device may be improved.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method comprising:
   forming a source/drain in a semiconductor substrate;
   forming a barrier layer over an upper surface of the semiconductor substrate before etching a trench in the semiconductor substrate;
   forming an isolation layer in the trench;
   performing thermal oxidation to diffuse the barrier layer; and
   forming a contact electrically coupled to the source/drain area,
   wherein the barrier layer diffuses into a side portion of the isolation layer through the thermal oxidation and physically separates the source/drain from the isolation layer,
   wherein the barrier layer isolates the isolation layer from the source/drain.

2. The method of claim 1, further comprising:
   forming a pad nitride layer over the semiconductor substrate, the pad nitride layer comprising an isolation layer area and a source/drain area;
   forming a barrier layer area by selectively removing a part of the pad nitride layer such that a part of the semiconductor substrate is exposed;
   forming the barrier layer over the exposed semiconductor substrate; and
   sequentially forming a gate electrode and the source/drain between adjacent isolation layers.

3. The method of claim 2, wherein the isolation layer area is defined by the barrier layer area.

4. The method of claim 2, wherein forming the source/drain comprises forming a photoresist pattern that exposes the source/drain area and the gate electrode, and implanting ions by using the gate electrode and the barrier layer as a mask.

5. The method of claim 1, wherein the contact is electrically coupled to the source/drain area and the isolation layer by interposing the barrier layer therebetween to prevent a contact spike from being generated.

6. The method of claim 1, wherein, forming the barrier layer comprises forming an oxide layer on an exposed portion of semiconductor substrate through thermal oxidation.

7. The method of claim 1, wherein forming the barrier layer comprises:
   forming an oxide layer on an exposed portion of semiconductor substrate through thermal oxidation; and
   depositing a nitride layer on the oxide layer.

8. The method of claim 1, wherein forming the barrier layer comprises:
   forming an oxide layer on an exposed portion of semiconductor substrate through thermal oxidation; and
   depositing a TEOS layer on the oxide layer.

9. The method of claim 1, wherein the barrier layer prevents a contact spike from occurring between the isolation layer and the source/drain when forming the contact.

* * * * *